(12) United States Patent
Hata et al.

(10) Patent No.: US 9,732,935 B2
(45) Date of Patent: Aug. 15, 2017

(54) LIGHT SOURCE DEVICE AND ILLUMINATION DEVICE

(71) Applicant: SHARP KABUSHIKI KAISHA, Osaka-shi, Osaka (JP)

(72) Inventors: Toshio Hata, Osaka (JP); Makoto Agatani, Osaka (JP); Tomokazu Nada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 378 days.

(21) Appl. No.: 14/405,941

(22) PCT Filed: Apr. 26, 2013

(86) PCT No.: PCT/JP2013/002846
§ 371 (c)(1),
(2) Date: Dec. 5, 2014

(87) PCT Pub. No.: WO2013/186977
PCT Pub. Date: Dec. 19, 2013

(65) Prior Publication Data
US 2015/0117020 A1 Apr. 30, 2015

(30) Foreign Application Priority Data

Jun. 11, 2012 (JP) ................................. 2012-132041
Jun. 18, 2012 (JP) ................................. 2012-137196

(51) Int. Cl.
*F21V 7/00* (2006.01)
*H01L 25/075* (2006.01)
(Continued)

(52) U.S. Cl.
CPC .......... *F21V 7/0066* (2013.01); *F21V 23/002* (2013.01); *F21V 23/005* (2013.01);
(Continued)

(58) Field of Classification Search
CPC .... F21V 7/0066; F21V 23/002; F21V 23/005; F21V 29/505; H01L 25/0753; H01L 33/60
(Continued)

(56) References Cited

U.S. PATENT DOCUMENTS

| 2011/0278605 A1 | 11/2011 | Agatani et al. |
| 2012/0106155 A1 | 5/2012 | Hata et al. |

(Continued)

FOREIGN PATENT DOCUMENTS

| CN | 201326926 Y | 10/2009 |
| CN | 102257318 A | 11/2011 |

(Continued)

OTHER PUBLICATIONS

Japanese Office Action and partial English translation thereof mailed Jul. 1, 2015 in JP application 2014-520878.
(Continued)

*Primary Examiner* — Jason Moon Han
(74) *Attorney, Agent, or Firm* — Nixon & Vanderhye P.C.

(57) ABSTRACT

A light source device is obtained, which has an enhanced light distribution characteristic with sufficiently homogeneous diffused light and can be readily manufactured with a simple configuration. The light source device has a substrate 2, a board-like first reflector 3 erected vertically to traverse a center section on the substrate 2 while both side surfaces face outward, and a plurality of LED chips 4 positioned on the substrate 2 as a plurality of light emitting elements so as to surround the first reflector 3. At least both side surfaces of the first reflector 3 have a light reflecting function. Thereby, a light source device is obtained, which has an enhanced light distribution characteristic with sufficiently homogeneous diffused light and can be readily manufactured with a simple configuration.

7 Claims, 7 Drawing Sheets

(51) Int. Cl.
*F21V 29/505* (2015.01)
*F21V 23/00* (2015.01)
*H01L 33/60* (2010.01)

(52) U.S. Cl.
CPC ........ *F21V 29/505* (2015.01); *H01L 25/0753* (2013.01); *H01L 33/60* (2013.01); *H01L 2224/48091* (2013.01); *H01L 2224/48137* (2013.01)

(58) Field of Classification Search
USPC ............... 362/241, 245, 249.02, 298, 311.02
See application file for complete search history.

(56) References Cited

U.S. PATENT DOCUMENTS

2012/0140517 A1   6/2012  Sakamoto et al.
2012/0300429 A1  11/2012  Jin

FOREIGN PATENT DOCUMENTS

| | | |
|---|---|---|
| JP | 62-110995 | 7/1987 |
| JP | 2011-065946 | 3/2011 |
| JP | 2012-004519 | 1/2012 |
| JP | 2012-094401 | 5/2012 |
| JP | 2012-099335 | 5/2012 |
| JP | 2012-248533 | 12/2012 |
| WO | WO 2010-136920 | 12/2010 |

OTHER PUBLICATIONS

International Search Report for PCT/JP2013/002846 mailed May 28, 2013.
Written Opinion of the International Searching Authority for PCT/JP2013/002846 mailed May 28, 2013.

(a)

(b)

(c)

(a)

(b)

(c)

LIGHT SOURCE DEVICE AND ILLUMINATION DEVICE

This application is the U.S. national phase of International Application No. PCT/JP2013/002846 filed 26 Apr. 2013 which designated the U.S. and claims priority to JP 2012-132041 filed 11 Jun. 2012, and JP 2012-137196 filed 18 Jun. 2012, the entire contents of each of which are hereby incorporated by reference.

TECHNICAL FIELD

The present invention relates to a light source device having an enhanced light distribution with a light distribution characteristic enhanced by using a light emitting device such as an LED (light emitting diode), and an illumination device such as an LED light bulb using the same.

BACKGROUND ART

In recent years, illumination instruments (e.g., LED light bulb) comprising a light source device using an LED have been used from the perspective of energy conservation. However, there is an issue in light source devices using an LED in that an angle of light distribution is small due to the structure, directivity of emitted light thereof, or the like. In this regard, various light emitting devices having a configuration to improve light distribution characteristics and illumination devices using the same have been proposed.

For example, Patent Literature 1 discloses that intense light can be radiated in a direction that is perpendicular to the axis of a substrate to broaden an irradiation range (light distribution region).

FIG. 8 is an enlarged perspective view of essential parts of a reflector used in a conventional illumination device disclosed in Patent Literature 1.

As shown in FIG. 8, a reflector 100 of a conventional illumination device is provided with a plurality of LED light sources 101, a heat dissipation section having a light source mounting surface on which the plurality of LED light sources 101 are provided in a circular shape, a cylindrical protruding section 102 that protrudes out in a direction of light emission from a center section of a light emitting surface of the LED light sources 101, and a reflection surface 104 on which light extraction windows 103 matching the position and shape of the LED light sources 101 are provided.

Light can be reflected with the protruding section 102 that protrudes out in a direction of light emission from a light emitting surface of the plurality of LED light sources 101 to emit light in a direction which is different from the direction of light emission. Thus, it is possible to broaden light distribution of an LED light bulb with a simple configuration of comprising the reflector 100 having the protruding section 102 in the middle.

FIG. 9 is a cross-sectional view of essential parts in a conventional light emitting device disclosed in Patent Literature 2.

As shown in FIG. 9, a conventional light emitting device 200 has a polygonal columnar structure 204 that penetrates through and protrudes out from a center section of a wiring substrate 202 on a metallic section 201, a light source section, which is provided so as to surround the columnar structure 204 and comprises a plurality of LED chips 203 as a plurality of light emitting elements, and a light converting member 205, which is provided so as to surround the columnar structure 204 and the plurality of LED chips 203 and absorbs at least a portion of light emitted by the plurality of LED chips 203 disposed on a side surface of the columnar structure 204 to emit light whose wavelength is converted.

The conventional light emitting device 200 can reduce unevenness in illuminance of light on an irradiated surface while retaining light distribution controllability by using an optical element.

FIG. 10 is a side view of a conventional marker lamp disclosed in Patent Literature 3.

As shown in FIG. 10, a conventional marker lamp 300 comprises: a substrate 301; a light emitting diode element 302 which is erected on the substrate 301 and has a large area of light distribution so as to surround a light axis; a light controlling member 303 that allows light on the light axis of the light emitting diode element 302 to linearly propagate without being obstructed and reflects radiated light in a peripheral section of the light axis in a substantially orthogonal direction; and a translucent globe 304 accommodating the substrate 301, the light emitting diode element 302, and the light controlling member 303. It is possible to readily obtain desirable light distribution that is readily visible without using a plurality of light emitting diode elements 302.

CITATION LIST

Patent Literature

Patent Literature 1: Japanese Laid-Open Publication No. 2011-159637
Patent Literature 2: Japanese Laid-Open Publication No. 2011-66307
Patent Literature 3: Japanese Laid-Open Publication No. 2004-300797

SUMMARY OF INVENTION

Technical Problem

However, the plurality of LED light sources 101 were formed individually around the reflector 100 of the conventional illumination device disclosed in Patent Literature 1 to diffuse light in a horizontal direction by the protruding section 102 of the reflector 100. The plurality of LED light sources 101 are placed individually in the light extraction window 103 in a recess. In addition, light is irradiated independently from the LED light sources 101, and the light hits the protruding section 102 of the reflector 100 and is reflected in a direction of a globe without colors of the light being sufficiently mixed. Thus, diffused light coming out from the globe cannot be considered as sufficiently homogeneous.

In the conventional light emitting device 200 disclosed in Patent Literature 2, the plurality of LED chips 203 are placed on a side surface of a polygonal columnar structure that penetrates through and protrudes out from a center section of the wiring substrate 202, and the light converting member 205 is further provided on the outside thereof. Thus, the method of manufacturing the light emitting device 200 is complex and difficult.

In the conventional marker lamp 300 disclosed in Patent Literature 3, the light controlling member 303, which controls the direction of progression of light by allowing light on the light axis of the light emitting diode element 302 to linearly propagate without being obstructed and reflecting radiated light in a peripheral section of the light axis in a substantially orthogonal direction, is disposed away from the light emitting diode element 302 as a light emitting device. Thus, it is difficult to match the light axes of the light emitting diode element 302 and the light controlling member 303.

Thus, realization of a light distribution characteristic that is equivalent to that of a conventional incandescent light bulb with a simpler configuration is desired.

The present invention solves the above-described conventional issues. The objective of the present invention is to provide a light source device, which can be readily manufactured with a simple configuration and enables an enhanced light distribution characteristic with a sufficiently homogeneous diffused light to be obtained, and an illumination device such as an LED light bulb using the light source device.

Solution to Problem

A light source device according to the present invention, comprising a reflector erected vertically on a substrate or above the substrate and a plurality of light emitting elements positioned on the substrate so as to surround the reflector, wherein at least both side surfaces of the reflector have a light reflecting function is provided, thereby achieving the objective described above.

Preferably, in the light source device according to the present invention, the plurality of light emitting elements are directly mounted on the substrate.

Still preferably, in the light source device according to the present invention, the reflector is directly mounted on the substrate and on a portion of a wiring pattern formed on the substrate.

Still preferably, in the light source device according to the present invention, the reflector is above the substrate and directly mounted on a sealing resin that seals the plurality of light emitting elements.

Still preferably, in the light source device according to the present invention, none of the plurality of light emitting Still preferably, in the light source device according to the present invention, the reflector is disposed to traverse a center section on the substrate or above the substrate in one or multiple directions.

Still preferably, in the light source device according to the present invention, the reflector has a board-like semi-circular shape, semi-oval shape, or arcuate shape of the side that is cut off from a circular shape with a chord.

Still preferably, in the light source device according to the present invention, the reflector is formed by a board-like semi-circular shape, semi-oval shape, or arcuate shape of the side that is cut off from a circular shape with a chord intersecting another board-like semi-circular shape, semi-oval shape, or arcuate shape on the side that is cut off from a circular shape with a chord at a center section on the substrate or above the substrate the substrate in a cross shape in plan view.

Still preferably, in the light source device according to the present invention, the reflector is disposed to traverse a center section of a light emitting section in which the plurality of light emitting elements are positioned.

Still preferably, in the light source device according to the present invention, the plurality of light emitting elements form the light emitting section by one or more series circuits, in which a plurality of light emitting elements are connected in series, being connected in parallel between bipolar wiring patterns.

Still preferably, in the light source device according to the present invention, the reflector consists of a white or opal acrylic or polycarbonate material.

Still preferably, in the light source device according to the present invention, the reflector is secured on the substrate with an adhesive, and a base of the reflector is secured by a sealing resin for sealing the plurality of light emitting elements and a resin dam for holding back the sealing resin.

Still preferably, in the light source device according to the present invention, a semi-toric or partially toric first frame reflector having heat conductivity traverses above the center of the substrate without contacting the light emitting section and are supported by a reflector support, which has heat conductivity and contacts the light emitting section, at a base of the first frame reflector.

Still preferably, in the light emitting device according to the present invention, a semi-toric or partially toric first frame reflector and a second frame reflector having heat conductivity intersect in a cross shape above the center of the substrate without contacting the light emitting section and are supported by a reflector support, which has heat conductivity and contacts the light emitting section, at a base of the first frame reflector and the second frame reflector.

Still preferably, in the light source device according to the present invention, the first frame reflector is disposed so as to surround the reflector and the reflector is coupled to the first frame reflector by the reflector support so that heat can be conducted.

Still preferably, in the light source device according to the present invention, at least a portion of the first frame reflector is enabled to contact a globe of an irradiation device.

Still preferably, in the light source device according to the present invention, the first frame reflector and the second frame reflector are disposed so as to surround the reflector and the reflector is coupled to the first frame reflector and the second frame reflector by the reflector support so that heat can be conducted.

Still preferably, in the light source device according to the present invention, at least a portion of the first frame reflector or/and the second frame reflector is enabled to contact a globe of an irradiation device.

An irradiation device according to the present invention is provided, where the light source device according to the present invention is installed on a mounting stage so that a bottom surface of the substrate faces the mounting stage.

Preferably, in the irradiation device according to the present invention, a transparent globe covering the light source device and the mounting stage are disposed on a housing.

The functions of the present invention having the structures described above will be described hereinafter.

The present invention comprises a reflector erected vertically on or above a substrate and a plurality of light emitting elements positioned on the substrate so as to surround the reflector, where the reflector has a light reflecting function on at least both side surfaces. The plurality of light emitting elements are directly mounted on the substrate.

Thereby, the plurality of light emitting elements are positioned on the substrate so as to surround the reflector. Thus, a light distribution characteristic can be enhanced by a reflector after emitted light from each of the plurality of light emitting elements directly mounted on the substrate readily diffuses into each other. Therefore, it is possible to readily manufacture a device with a simple configuration and to obtain an enhanced light distribution characteristic with sufficiently homogeneous diffused light.

Advantageous Effects of Invention

According to the present invention as described above, since a plurality of light emitting elements are positioned on a substrate so as to surround a reflector, a light distribution characteristic can be enhanced by a reflector after emitted light from each of the plurality of light emitting elements directly mounted on the substrate readily diffuses into each other. In addition, it is possible to readily manufacture a device with a simple configuration and to obtain an enhanced light distribution characteristic with sufficiently homogeneous diffused light.

BRIEF DESCRIPTION OF THE DRAWINGS

FIG. 1(a) is a top view of the light source device. FIG. 1(b) is a partial side view and a partial cross-sectional view in direction B seen from direction A of FIG. 1(a). FIG. 1(c) is a cross-sectional view in direction A seen from direction B of FIG. 1(a).

FIG. 3(a) is a top view of the light source device. FIG. 3(b) is a partial side view and a partial cross-sectional view in direction B seen from direction A of FIG. 3(a). FIG. 3(c) is a partial side view and a partial cross-sectional view in direction A seen from direction B of FIG. 3(a).

FIG. 5(a) is a top view of the light source device. FIG. 5(b) is a partial side view and a partial cross-sectional view in direction B seen from direction A of FIG. 5(a). FIG. 5(c) is a partial side view and a partial cross-sectional view in direction A seen from direction B of FIG. 5(a).

Figure 1:
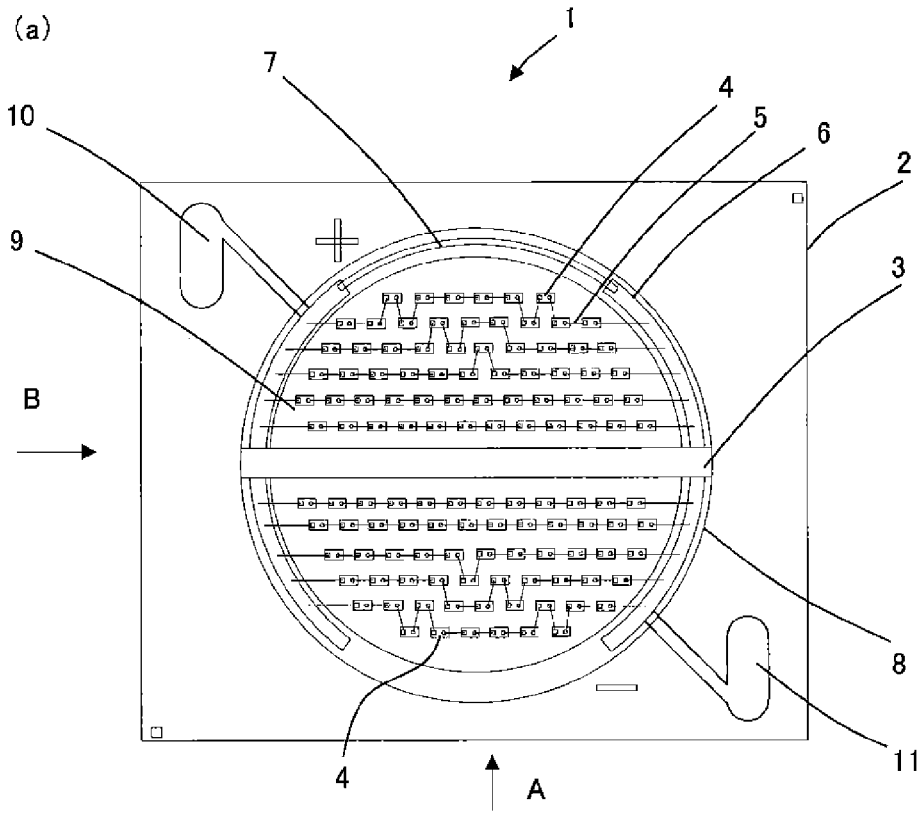
FIG. 1 is a diagram of a configuration of essential parts of a light source device of Embodiment 1 of the present invention.
Figure 1:
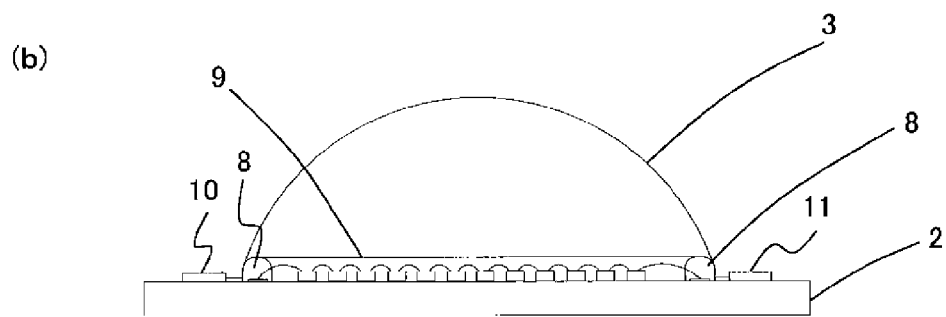
Figure 1:
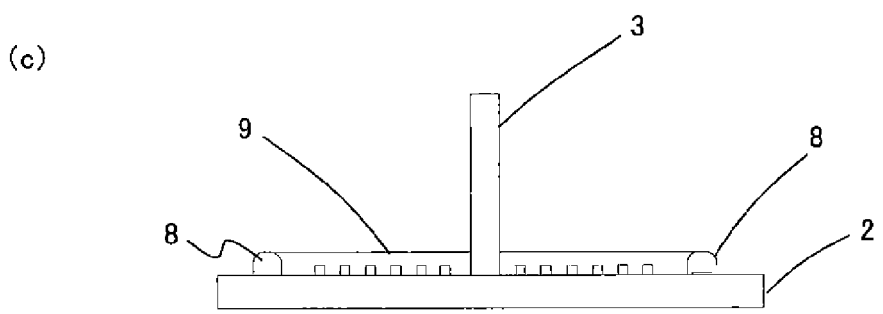

REFERENCE SIGNS LIST 1, 1A, and 1B light source device
2 substrate
3 first reflector
3A second reflector
3B third reflector
3D fourth reflector
3E fifth reflector
3F reflector support
4 LED chip (light emitting element)
5 wire
6 wiring pattern
7 printed resistance
8 resin dam
9 sealing resin
10 anode area (voltage applying terminal)
11 cathode area (voltage applying terminal)
20A, 20B LED light bulb (irradiation device)
21 housing
22 mounting stage
23 base
24 globe

DESCRIPTION OF EMBODIMENTS

Hereinafter, Embodiments 1-3 of a light source device of the present invention using a light emitting device such as an LED to enhance a light distribution characteristic and Embodiment 4 of an irradiation device using the same will be explained in detail while referring to the drawings. In addition, from the standpoint of creating the Figures, the thickness, length, and the like of each constituent member in each Figure is not limited to the illustrated configuration.

Embodiment 1

Figure 2:
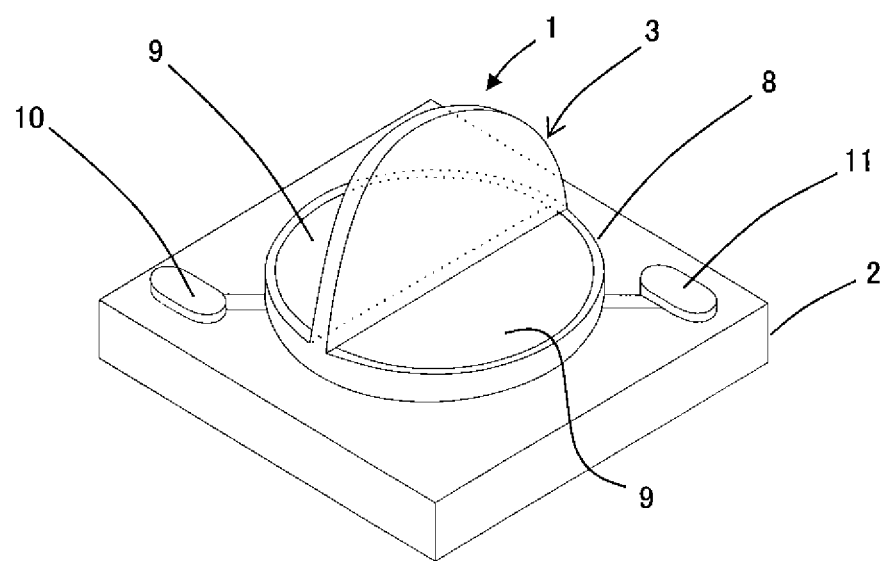
FIG. 2 is a perspective view of the light source device of FIG. 1.

FIG. 1 is a diagram of a configuration of essential parts of a light source device of Embodiment 1 of the present invention. FIG. 1(a) is a top view of the light source device. FIG. 1(b) is a partial side view and a partial cross-sectional view in direction B seen from direction A of FIG. 1(a). FIG. 1(c) is a cross-sectional view in direction A seen from direction B of FIG. 1(a). FIG. 2 is a perspective view of the light source device of FIG. 1. In FIG. 1(b), only a resin dam 8 and sealing resin 9 show a cross-section. A substrate 2, first reflector 3, anode area 10, and cathode area 11 show a side surface. In FIG. 1(c), the substrate 2, first reflector 3, resin dam 8, and sealing resin 9 show a cross section.

As shown in FIGS. 1(a)-1(c) and 2, a light source device 1 of Embodiment 1 comprises: a substrate 2; a semi-circular (or oval) board-like first reflector 3 having a light reflecting function; a plurality of LED chips 4 provided directly on the substrate 2 as light emitting elements; a wire 5 that sequentially connects each of the LED chips 4; a wiring pattern 6 formed on the substrate 2; a printed resistance 7 formed between the wiring pattern 6 on the substrate 2 as a protective wiring; a resin dam 8 surrounding the arrangement of the plurality of LED chips 4; a sealing resin 9 for sealing the plurality of LED chips 4, wire 5 and the like; an anode area 10 as one of the voltage applying terminals; and a cathode area 11 as the other voltage applying terminal.

The substrate 2 is a ceramic substrate on which the wiring pattern 6 and the printed resistance 7 are formed. The dimension of the substrate 2 in plan view is, for example, 24 mm×20 mm, and the thickness thereof is 1 mm.

The first reflector 3 has a board-like, semi-circular shape with a predetermined thickness. The first reflector 3 is disposed so as to traverse the center of a light emitting section that is circular in plan view. In other words, the first reflector 3 has a semi-circular shape while both side surfaces face outward and is erected and disposed to be vertical with respect to the top surface of the substrate 2. Outside surfaces of the first reflector 3 (at least both side surfaces) have a light reflecting function.

The material of the first reflector 3 is preferably, for example, a white or opal acrylic or polycarbonate material. The dimension of the reflector 3 is, for example, 7 mm in height of the body and 1 mm in thickness. The first reflector 3 is directly attached and erected on the substrate 2 and a portion of the top surface of the wiring pattern 6 on the substrate 2 with a resin-based adhesive. Furthermore, the first reflector 3 is secured on the substrate 2 with an adhesive (resin-based adhesive) in an erected state. The base on the first reflector 3 is supported peripherally by the sealing resin 9 for sealing the plurality of LED chips 4 and the resin dam 8 for holding back the sealing resin 9.

The LED chips 4 are, but not limited to, blue LEDs. The LED chips 4 are directly mounted on the top surface of the substrate 2. Multiple LED chips 4 are provided (herein, 120 LEDs). The multiple LED chips 4 are electrically connected by the wire 5 between the anode area 10 and the cathode area 11 for each semi-circular light emitting region formed by the first reflector 3 dividing a circular light emitting section in 12 series and 5 parallels. That is, 12 LED chips 4 are connected in series, and 5 sets thereof are connected in parallel. The LED chips 4 are directly connected with the wire 5 by a wire bonding method. Further, the LED chips 4 and the wiring pattern 6 are also connected with the wire 5 by a wire bonding method.

The wiring pattern 6 is formed on one of the surfaces (top surface) of the substrate 2. The wiring pattern 6 includes the anode area 10, cathode area 11, and the like which are externally connectable.

The printed resistance 7 is a protective wiring that is a measure against surges to the LED chips 4. The printed resistance 7 is formed to be connected in parallel to every group of circuits of the LED chips 4 at one location on the top surface of the substrate 2. A protection wiring that is a measure against surges is not limited to the printed resistance 7. A protective element such as a Zener diode can be substituted for the printed resistance 7.

The resin dam 8 is a resin for holding back the sealing resin 9. The resin dam 8 is provided in a toric shape in plan view in an arcuate region, excluding the first reflector 3, outside the semi-circular mounting regions of the plurality of LED chips 4 on the top surface of the substrate 2. The resin dam 8 is composed of an insulating resin material with color (white or opal is preferable). For example, the resin dam 8 consists of white silicone resin (containing filler $TiO_2$). The resin dam 8 is formed on the substrate 2 in a liquid form and thermally cured while being maintained at 150° C. for 60 minutes. The dimensions of the resin dam 8 are, for example, a width of the resin dam 8 of 1 mm, a height of 1 mm, and a diameter of a toric shape in plan view (the first reflector 3 is provided therein) of 25 mm.

The sealing resin 9 is a resin layer for sealing the LED chips 4 and the wire 5. The sealing resin 9 is provided to fill a circular section surrounded by the resin dam 8 (excluding the region where the first reflector 3 is disposed) on a top surface of the substrate 2. Accordingly, the sealing resin 9 is provided in a circular shape excluding the region where the first reflector is disposed. The sealing resin 9 is composed of a phosphor-containing insulating resin material, e.g., phosphor-containing silicone resin. The sealing resin 9 is injected into a circular region surrounded by the resin dam 8 (excluding the region where the first reflector 3 is disposed) in a liquid state with phosphor dispersed therein and formed by thermally curing while being maintained at 150° C. for 5 hours.

The phosphor may be selected so that light radiated from the LED chips 4 is converted to a desirable color. For example, when using blue LED chips 4 to emit white light, two types of phosphors can be used, a green phosphor (e.g., $Ca_3(Sc.Mg)_2Si_3O_{12}:Ce$) and a red phosphor (e.g., $(Sr.Ca)AlSiN_3:Eu$). In this manner, light emission in a desirable color can be readily obtained at a light emitting section by sealing the LED chips 4 with the phosphor-containing sealing resin 9 and combining and selecting a phosphor with the color of light emitted by the LED chips 4.

From the above, according to Embodiment 1, a light source device comprises the substrate 2, the board-like first reflector 3 erected vertically so as to traverse the center portion on the substrate 2 while both side surfaces face outward, and the plurality of LED chips 4, as a plurality of light emitting elements, positioned on the substrate 2 to surround the first reflector 3. At least both side surfaces of the first reflector 3 have a light reflecting function.

In this manner, the plurality of LED chips 4 are directly positioned on the substrate 2. Since light, which is irradiated and diffused from the LED chips 4 without anything to obstruct the light in the periphery from a large area (flat light emitting section consisting of a plurality of light emitting elements) with the colors mixed, is irradiated onto the first reflector 3, light from the globe also would be excellent diffused light.

Further, since the first reflector 3 is formed to traverse the center of the light emitting section, light axes can be readily matched.

Furthermore, the wiring pattern 6 is formed on the substrate 2, and the first reflector 3 is formed on at least a portion of the wiring pattern 6. Since the first reflector 3 is erected using a resin based adhesive on the wiring pattern 6 in this manner, the first reflector 3 can be readily erected. In addition, since the first reflector 3 is secured with not only the resin based adhesive, but also with the resin dam 8 and the sealing resin 9, the first reflector 3 is firmly secured.

In Embodiment 1, the first reflector 3 is configured to be erected on the substrate 2. However, the configuration is not limited thereto. The first reflector 3 may be erected on the aforementioned sealing resin 9.

Since the first reflector 3 is erected by adhesion with a translucent resin adhesive on the sealing resin 9 above the substrate 2, the first reflector 3 can be more readily formed. In sum, there would not be any wasted portion in the first reflector 3 in comparison to forming the first reflector 3 on the substrate 2 from the beginning because the first reflector 3 is formed on a user-selected light emitting section (on the sealing resin 9) that satisfies a predetermined luminance and chromaticity.

Embodiment 2

The above-described Embodiment 1 explains a case of using the semi-circular, board-like first reflector 3 with a light reflecting function to enhance a light distribution characteristic. However, Embodiment 2 explains a case of using a second reflector 3A mentioned below, which is a semi-circular, board-like reflector with a light reflecting function intersected with another semi-circular, board-like reflector with a light reflecting function in a cross shape, to further enhance a light distribution characteristic.

Figure 3:
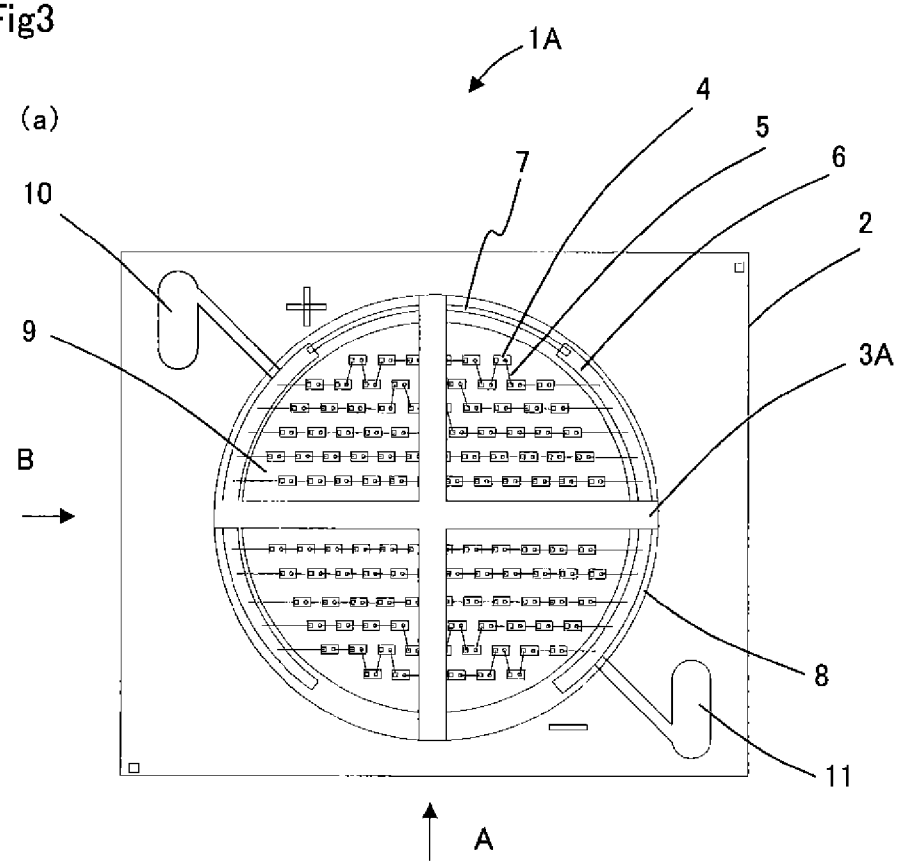
FIG. 3 is a diagram of a configuration of essential parts of a light source device in Embodiment 2 of the present invention.
Figure 3:
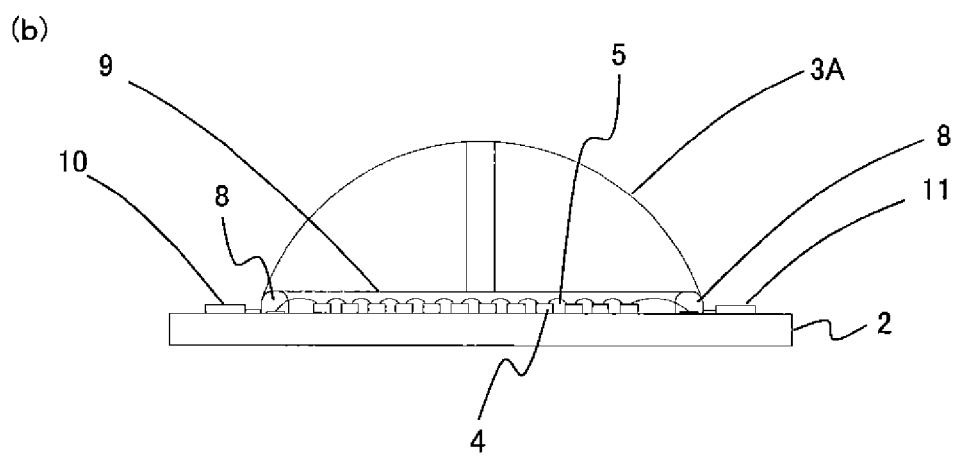
Figure 3:
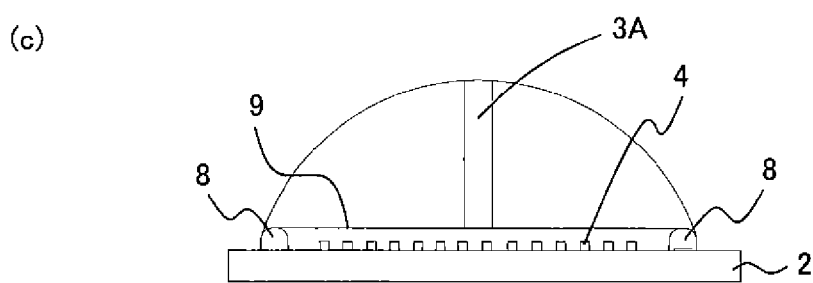
Figure 4:
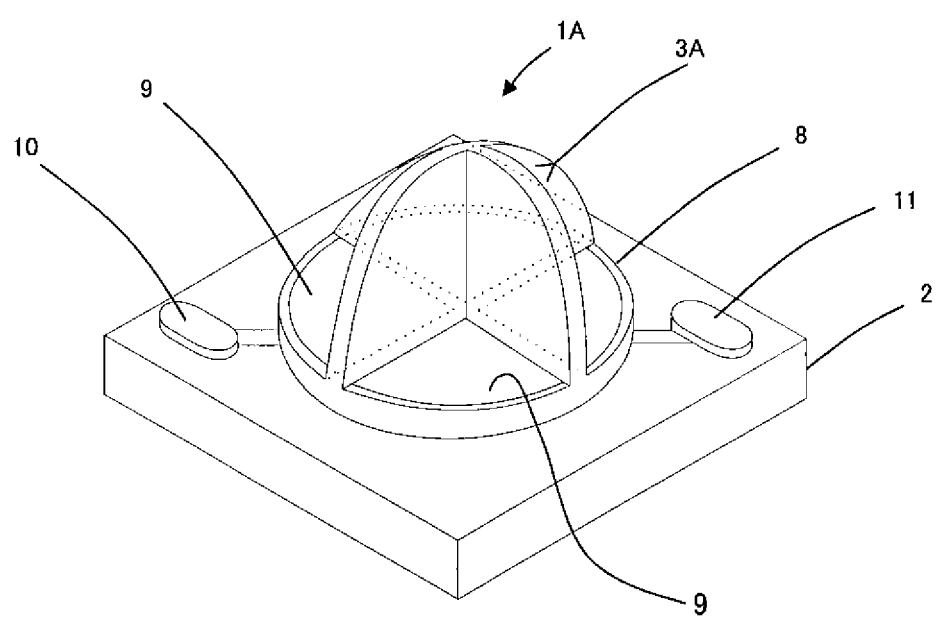
FIG. 4 is a perspective view of the light source device of FIG. 3.

FIG. 3 is a diagram of a configuration of essential parts of a light source device in Embodiment 2 of the present invention. FIG. 3(a) is a top view of the light source device. FIG. 3(b) is a partial side view and a partial cross-sectional view in direction B seen from direction A of FIG. 3(a). FIG. 3(c) is a partial side view and a partial cross-sectional view in direction A seen from direction B of FIG. 3(a). FIG. 4 is a perspective view of the light source device of FIG. 3. In FIG. 3(b), only a resin dam 8 and sealing resin 9 shows a cross section, and substrate 2, second reflector 3A, anode area 10 and cathode area 11 show a side surface. In FIG. 3(c), the substrate 2, the resin dam 8, and the sealing resin 9 show a cross section and only the first reflector 3A show a cross section. Further, the second reflector 3A with a cross shape in plan view may be erected on the substrate 2 or on the sealing resin 9 while straddling over the resin dam 8. However, the second reflector 3A with a cross shape in plan view is herein erected on the sealing resin 9 while straddling over the resin dam 8. FIGS. 3 and 4 provide explanations by affixing the same symbol on members that achieve the same working as those in FIGS. 1 and 2.

As shown in FIGS. 3(a)-3(c) and 4, a light source device 1A of Embodiment 2 comprises: a substrate 2; a second reflector 3A with a cross shape in plan view having a light reflecting function on both side surfaces; a plurality of LED chips 4 as light emitting elements provided on the substrate 2; a wire 5 that sequentially connects each of the LED chips 4; a wiring pattern 6 formed on the substrate 2; a printed resistance 7 as a protective wiring formed between wiring patterns 6 on the substrate 2; a resin dam 8 surrounding the arrangement of the plurality of LED chips 4; a sealing resin 9 for sealing the plurality of LED chips 4, wire 5 and the like; an anode area 10 as one of the voltage applying terminals; and a cathode area 11 as the other voltage applying terminal.

The substrate 2 is a ceramic substrate on which the wiring pattern 6 and printed resistance 7 are formed on the top surface. The dimension of the substrate 2 in plan view is, for example, 24 mm×20 mm, and the thickness thereof is 1 mm.

The wiring pattern 6 is formed on one of the surfaces of the substrate 2. The wiring pattern 6 includes the anode area 10, cathode area 11, and the like which are externally connectable.

The LED chips 4 are, but not limited to, blue LEDs. LED chips 4 are directly mounted on the top surface of the substrate 2. Multiple LED chips 4 are provided (herein, 120 LEDs). The multiple LED chips 4 are electrically connected by the wire 5 between the anode area 10 and the cathode area 11 for each light emitting region with a semi-circular shape in plan view excluding the second reflector 3A with a cross shape in plan view in 12 series and 10 parallels (12 LED chips 4 are connected in series, and 10 sets thereof are connected in parallel). The LED chips 4 are directly connected with the wire 5 by a wire bonding method. Further, the LED chips 4 and the wiring pattern 6 are also connected with the wire 5 by a wire bonding method.

The second reflector 3A is disposed in a cross shape in plan view so as to traverse the center of a light emitting section. A semi-circular reflector is combined to intersect with another semi-circular reflector perpendicularly at the center to form a cross shape in plan view. The second reflector 3A with a cross shape in plan view is erected on the sealing resin 9 while straddling over the resin dam 8. In other words, the second reflector 3A is erected vertical to a surface of the sealing resin 9 while both side surfaces face outward. More specifically, the second reflector 3A is erected vertical to the surface of a light emitting section. Among the outer surfaces of the second reflector 3A, at least all side surfaces have a light reflecting function.

The second reflector 3A preferably consists of, for example, a white or opal acrylic or polycarbonate material. The second reflector 3A is a board-like material with dimensions of, for example, 6 mm in height of the body and 1 mm in thickness.

The second reflector 3A is provided herein on the top surfaces of the sealing resin 9 and the resin dam 8 by a translucent adhesive.

Furthermore, when the second reflector 3A is formed on the sealing resin 9, it is desirable that the LED chips 4 are not formed below one of the circular reflectors of the second reflector 3A. This is because the second reflector 3A would obstruct light emitted from the LED chips 4 acting as light emitting elements. Thus, although LED chips 4 are formed below one of the circular reflectors of the second reflector 3A in FIG. 3(c), it is desirable that the LED chips 4 are not formed below one of the circular reflectors of the second reflector 3A in Embodiment 2. The LED chips 4 are formed below at least the other circular reflector of the second reflector 3A.

According to Embodiment 2 from above, a light source device comprises the substrate 2, the board-like second reflector 3A erected vertically so as to traverse a center portion on the substrate 2 while both side surfaces face outward, and the plurality of LED chips 4 as a plurality of light emitting elements positioned to surround the second reflector 3A on the substrate 2. The second reflector 3A has a light reflecting function on at least each of the side surfaces.

The second reflector 3A is disposed such that one of the board-like reflectors intersects another board-like reflector in a different direction (herein, perpendicular direction) at a center section in a cross shape in plan view.

In this manner, the plurality of LED chips 4 are directly positioned on the substrate 2. Since light, with the colors mixed, from a large area (flat light emitting section consisting of a plurality of light emitting elements) is irradiated onto the second reflector 3A, light from the globe would also be excellent diffused light. In this manner, since light is diffused in four directions, there is more light diffusion effect in comparison to the aforementioned case of Embodiment 1 with only the first reflector 3.

Further, since the second reflector 3A is formed to traverse the center of a light emitting section, light axes can be readily matched.

Furthermore, the second reflector 3A with a cross shape in plan view is erected on the sealing resin 9 while straddling over the resin dam 8. However, the configuration may be such that the wiring pattern 6 is formed on the substrate 2 and the second reflector 3A is formed on at least a portion of the wiring pattern 6 (on the substrate 2). Since the second reflector 3A is erected using a resin based adhesive on the wiring pattern 6 in this manner, the second reflector 3A can be readily erected. In addition, since the second reflector 3A is secured with not only the resin based adhesive, but also with the resin dam 8 and the sealing resin 9, the second reflector 3A is firmly secured.

As stated above, the configuration may be such that the wiring pattern 6 is formed on the substrate 2 and the second reflector 3A is formed on at least a portion of the wiring pattern 6. However, the second reflector 3A is formed on the sealing resin 9 in Embodiment 2. In this case, the plurality of LED chips 4 may be placed below a reflector of the second reflector 3A. However, since light from the LED chips 4 is obstructed by a reflector, it is desirable that the LED chips 4 are not placed below a reflector.

Since the second reflector 3A is attached and erected on the sealing resin 9 with a translucent resin adhesive, the second reflector 3A can be more readily formed in comparison to a case of forming the second reflector 3A on at least a portion of the wiring pattern 6. In sum, there would not be any wasted portion in the second reflector 3A in comparison to forming the second reflector 3A on the substrate 2 from the beginning because the second reflector 3A is formed on a user-selected light emitting section (on the sealing resin 9) that satisfies a predetermined luminance and chromaticity.

Embodiment 2 explains a case of further enhancing a light distribution characteristic using the second reflector 3A in which two semi-circular board-like reflectors with a light reflecting function are intersected in a cross-shape. However, the second reflector 3A is not limited to two board-like reflectors intersected in a cross shape in this manner. Two board-like reflectors may be intersected at a predetermined angle. In this case, a light emitting surface is divided into 4 surfaces. However, a light emitting surface may be divided into three surfaces, five surfaces, or into multiple surfaces. A light emitting surface may be divided by a reflector into multiple equal or unequal surfaces.

Although the above-described Embodiments 1 and 2 do not particularly explain in detail, the first reflector 3 or the second reflector 3A, as a reflector, is disposed to traverse a center section on or above the substrate 2 in one or multiple directions. A reflector has a board-like semi-circular shape, semi-oval shape, or arcuate shape of the side that is cut off from a circular shape with a chord. Further, a reflector is formed by a board-like semi-circular shape, semi-oval shape, or arcuate shape of the side that is cut off from a circular shape with a chord intersecting another board-like semi-circular shape, semi-oval shape, or arcuate shape on the side that is cut off from a circular shape with a chord at a center section on or above the substrate 2 in a cross shape in plan view.

Embodiment 3

The above-described Embodiments 1 and 2 explain a case of enhancing a light distribution characteristic by using a reflector. However, Embodiment 3 explains a case of enhancing a light distribution characteristic by using a third reflector in addition to using a fourth reflector (first frame reflector) and a fifth reflector (second frame reflector) for dissipating heat from the third reflector.

Figure 5:
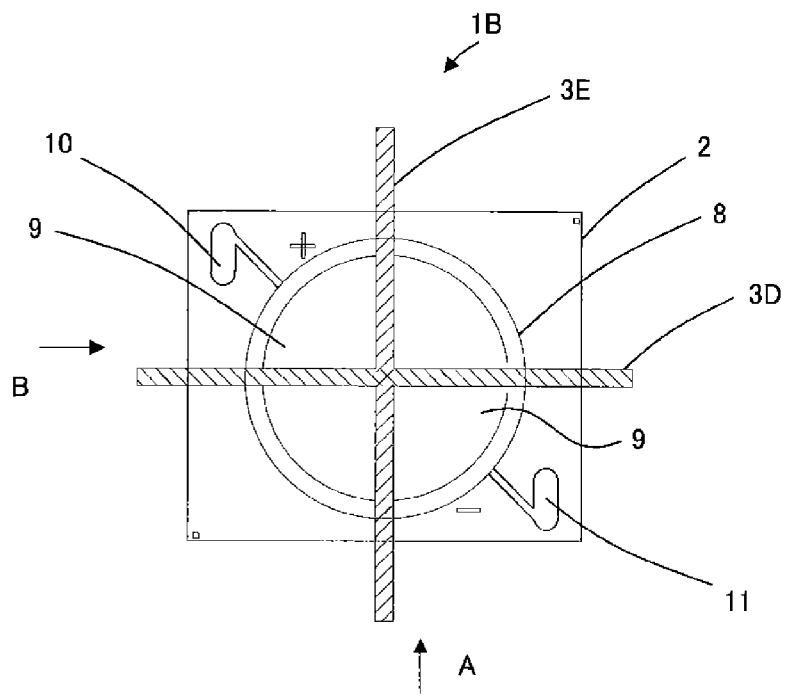
FIG. 5 is a diagram of the configuration of essential parts of a light source device in Embodiment 3 of the present invention.
Figure 5:
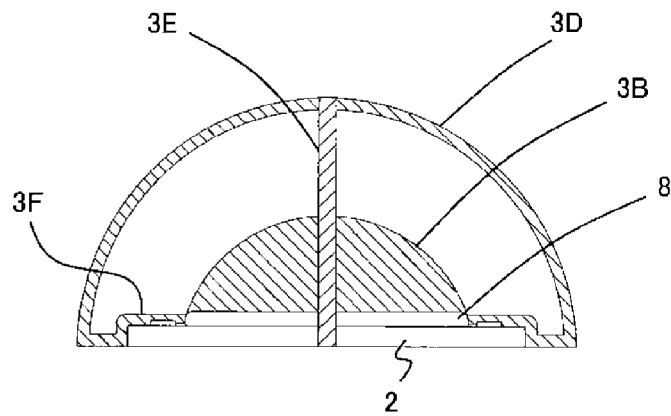
Figure 5:
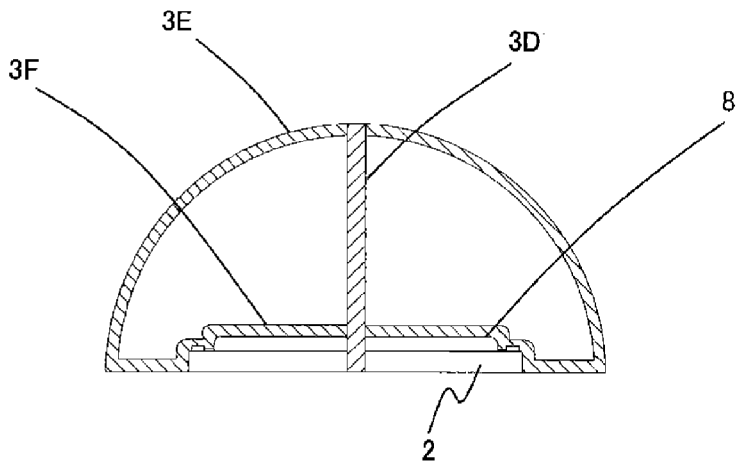

FIG. 5 is a diagram of the configuration of essential parts of a light source device in Embodiment 3 of the present invention. FIG. 5(a) is a top view of the light source device. FIG. 5(b) is a partial side view and a partial cross-sectional view in direction B seen from direction A of FIG. 5(a). FIG. 5(c) is a partial side view and a partial cross-sectional view in direction A seen from direction B of FIG. 5(a). In FIG. 5(b), a substrate 2, resin dam 8, and fifth reflector 3E show a side surface on the proximal side, and a third reflector 3B, fourth reflector 3D, and reflector support 3F show a cross-section. In FIG. 5(c), a substrate 2, resin dam 8, and fourth reflector 3D show a side surface on the proximal side and a fifth reflector 3E and reflector support 3F show a cross section. Further, FIG. 5 provides explanation by affixing the same symbol on members that achieve the same working effect as those in FIGS. 3 and 4.

As shown in FIGS. 5(a)-5(c), a light source device 1B of Embodiment 3 comprises: a substrate 2, a semi-circular board-like third reflector 3B; a forth reflector 3D (first frame reflector) and a fifth reflector 3E (second frame reflector) with a semi-arcuate frame shape; a reflector support 3F connected thereto; a plurality of LED chips 4 (not shown) provided on the substrate 2 as light emitting elements; a wire 5 (not shown) that sequentially connects each of the LED chips 4; a wiring pattern 6 (not shown) formed on the substrate 2; a printed resistance 7 as a protective wiring (not shown) formed between the wiring patterns 6 on the substrate 2; a resin dam 8 surrounding the arrangement of the plurality of LED chips 4; a sealing resin 9 for sealing the plurality of LED chips 4, wire 5 and the like; an anode area 10 as one of the voltage applying terminals; and a cathode area 11 as the other voltage applying terminal.

The substrate 2 is a ceramic substrate on which the wiring pattern 6 and printed resistance 7 are formed. The dimension of the substrate 2 in plan view is, for example, 24 mm×20 mm, and the thickness thereof is 1 mm.

The wiring pattern 6 is formed on one of the surfaces (top surface) of the substrate 2. The wiring pattern 6 includes the anode area 10, cathode area 11 and the like which are externally connectable.

The third reflector 3B is semi-circular and board-like. The third reflector 3B is disposed to traverse the center of a light emitting section with a circular shape in plan view. In other words, the third reflector 3B has a semi-circular shape and is disposed to be erected vertical to a surface of the substrate 2 while both side surfaces face outward. Among the outer surfaces of the third reflector 3B, at least both side surfaces have a light reflecting function. The fourth reflector 3D, fifth reflector 3E, and the reflector support 3F are formed to be linked to (integrated with) the third reflector 3B.

The material of the third reflector 3B preferably consists of, for example, a white or opal acrylic or polycarbonate material. The dimension of the third reflector 3B is, for example, 6 mm in height of the body and 1 mm in thickness. The reflector 3B is erected on the top surface of the substrate 2 with a resin based adhesive.

The fourth reflector 3D and the fifth reflector 3E both have a semi-arcuate frame shape with a predetermined width. The fourth reflector 3D and the fifth reflector 3E, which are frame bodies with a heat dissipating function and a reflecting function, are formed to surround the third reflector 3B from above. In addition, the third reflector 3B is linked to the fourth reflector 3D and fifth reflector 3E by the reflector support 3F. The fourth reflector 3D and the fifth reflector 3E with a predetermined width are formed in a semi-arcuate shape and intersect in a cross shape in plan view at a location above the center of a light emitting section with a circular shape in plan view. The arcuate fourth reflector 3D is positioned above the semi-circular end surface side of the third reflector 3B at a predetermined distance.

According to Embodiment 3 above, a light source device comprises the substrate 2, the board-like third reflector 3B erected vertically to traverse a center portion on the substrate 2 while both side surfaces face outward, and the plurality of LED chips 4 as a plurality of light emitting elements positioned to surround the third reflector 3B on the substrate 2. The third reflector 3B has a light reflecting function on at least both of the side surfaces.

The fourth reflector 3D and the fifth reflector 3E are configured in a semi-arcuate frame shape, which do not contact a light emitting section, and the reflector support section 3F (reflector support) supporting them is provided.

In sum, the fourth reflector 3D and the fifth reflector 3E are formed to surround the third reflector 3B, and the third reflector 3B is linked to the fourth reflector 3D and fifth reflector 3E by the reflector support 3F. At least one of the fourth reflector 3D and the fifth reflector 3E contacts the globe.

Thereby, heat from a light emitting section is transferred to the fourth reflector 3D and the fifth reflector 3E from the substrate 2 via the reflector supporting section 3F and heat is dissipated from a portion contacting the globe. Further, radiant heat from the third reflector 3B can be dissipated toward the direction of the globe.

In Embodiment 3, a semi-toric (or partially toric) first frame reflector (fourth reflector 3D) and a second frame reflector (fifth reflector 3E) having heat conductivity intersect in a cross shape above the center of the substrate 2 without contacting a light emitting section and are supported by the reflector supporting section 3F, which has heat conductivity and contacts the light emitting section, at the base of the first frame reflector and the second frame reflector. Further, the first frame reflector and the second frame reflector are provided to surround the third reflector 3B as a reflector. The third reflector 3B as a reflector is linked to the first frame reflector and the second frame reflector by the reflector support 3F so that heat can be conducted. Furthermore, at least a portion of the first frame reflector and/or second frame reflector is enabled to contact a globe of an irradiation device explained in the following Embodiment 4. However, the configuration is not limited thereto. The configuration may be such that the semi-toric (or partially toric) first frame reflector (fourth reflector 3D) or second frame reflector (fifth reflector 3E) having heat conductivity traverses above a center section of the substrate 2 without contacting a light emitting section and are supported by the reflector supporting section 3F, which has heat conductivity and contacts the light emitting section, at the base of the first frame reflector (fourth reflector 3D) or second frame reflector (fifth reflector 3E). Further, the configuration may be such that the first frame reflector (fourth reflector 3D) or second frame reflector (fifth reflector 3E) is provided to surround the third reflector 3B as a reflector, and the third reflector 3B as a reflector is linked to the first frame reflector (fourth reflector 3D) or second frame reflector (fifth reflector 3E) by the reflector support 3F so that heat can be conducted. Furthermore, at least a portion of the first frame reflector (fourth reflector 3D) or second frame reflector (fifth reflector 3E) may be enabled to contact a globe of an irradiation device explained in the following Embodiment 4.

An irradiation device in which the light source device 1, 1A, or 1B of the above Embodiments 1-3 is installed on a mounting stage so that a bottom surface of the substrate 2 faces the mounting stage is explained in the following Embodiment 4.

Embodiment 4

The above-described Embodiments 1-3 explain the light source devices 1, 1A, and 1B having an enhanced light distribution with a light distribution characteristic enhanced by using a reflector. However, Embodiment 4 explains an LED light bulb as an irradiation device using the light source device 1A or 1B.

Figure 6:
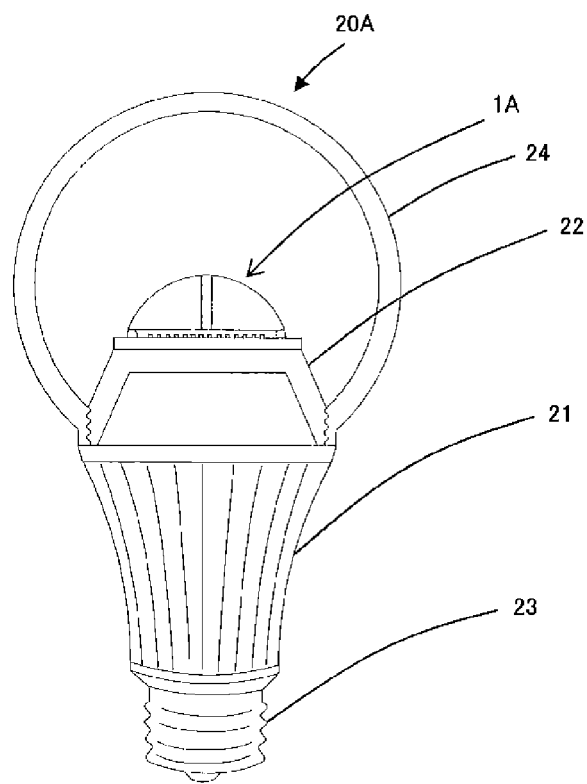
FIG. 6 is a partial cross sectional view schematically showing an example of a configuration of the LED light bulb of Embodiment 4 of the present invention.

FIG. 6 is a partial cross-sectional view schematically showing an example of a configuration of an LED light bulb of Embodiment 4.

As shown in FIG. 6, an LED light bulb 20A of Embodiment 4 comprises a housing 21, a mounting stage 22, a base 23, a globe 24, and the light source device 1A.

The housing 21 has an inverse truncated cone shape. The mounting stage 22 is fixed to the housing 21 on the top surface side and the base 23 is fixed to the bottom surface side. A circuit board in which a drive circuit is configured (not shown) is stored inside the housing 21.

The mounting stage 22 has a circular shape in plan view. The light source device 1A is installed on one of the mounting surfaces of the mounting stage 22 and the globe 24 is installed on the other side. A through hole is formed at the center of the mounting stage 22. The light source device 1A is installed on the mounting stage 22 so that the bottom surface of the substrate 2 faces the mounting stage 22.

The base 23 is, for example, an E-type base. When using the LED light bulb 20A, the base 23 is screwed into a socket to enable electricity to flow to the light source device 1A.

The globe 24 is a cover member made of a transparent resin or the like for covering the light source device 1A and has a semi-spherical shape. The globe 24 is secured to the bottom side of the mounting stage 22 so as to cover the mounting surface of the mounting stage 22 and the light source device 1A. The globe 24 preferably consists of, for example, an opal glass, acrylic, or polycarbonate material. The dimension of the globe 24 is, for example, 60 mm in diameter (outer diameter) and 2.5 mm in thickness.

In this regard, conventional globes 24 are formed in opal or white color in order to diffuse light from a light source. However, the globe 24 may be made of translucent or transparent resin, glass or the like because light diffuses sufficiently with only the light source devices 1, 1A, or 1B. Conventional globes have incurred several percent in loss of light. However, there is an effect of reducing loss of light from a globe by using the light source device 1, 1A or 1B.

The light source device 1A has two lead wires (not shown) for cathode and anode. The lead wires are provided on the inside of a cylinder, where the lead wires are lead inside the housing 21 through a through hole of the mounting stage 22. The lead wires are then electrically connected to the drive circuit (not shown) stored in the housing 21.

Figure 7:
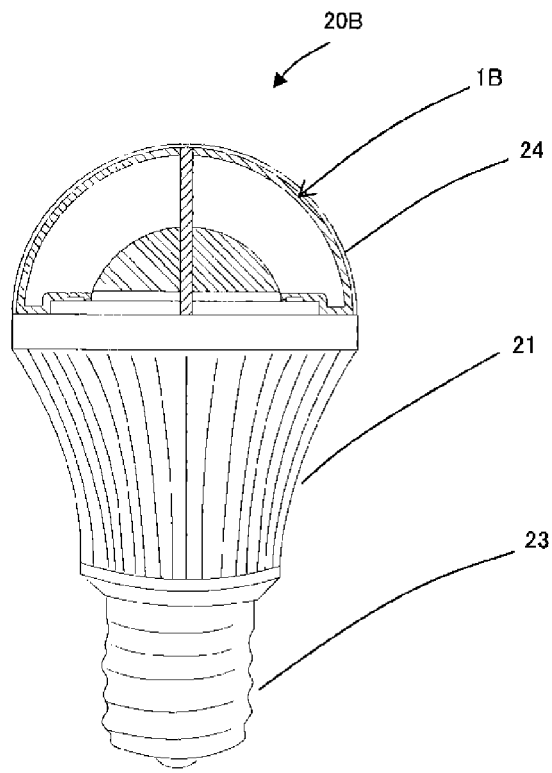
FIG. 7 is a side view schematically showing an example of another configuration of the LED light bulb of Embodiment 4 of the present invention.
Figure 8:
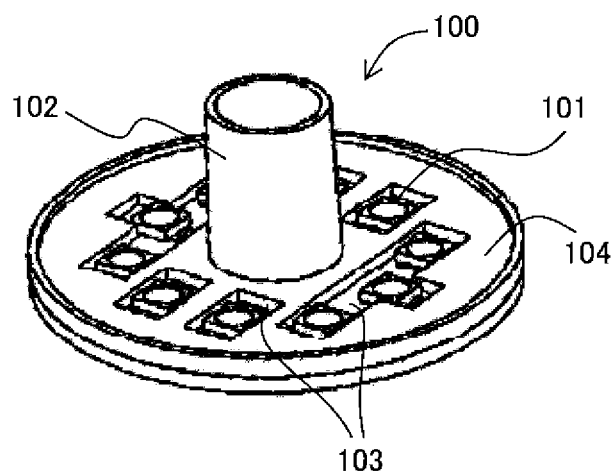
FIG. 8 is an enlarged perspective view of essential parts of a reflector used in a conventional illumination device disclosed in Patent Literature 1.
Figure 9:
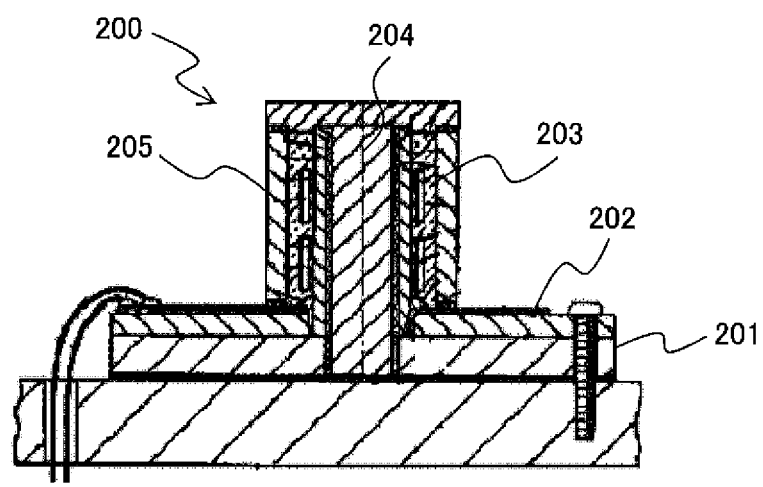
FIG. 9 is a cross-sectional view of essential parts in a conventional light emitting device disclosed in Patent Literature 2.
Figure 10:
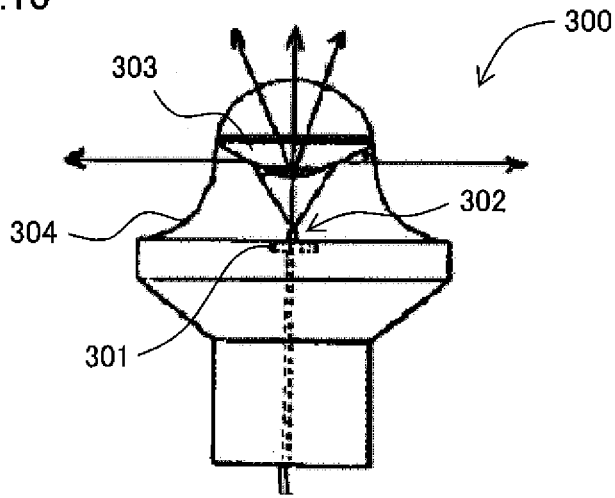
FIG. 10 is a side view of a conventional marker lamp disclosed in Patent Literature 3.

FIG. 7 is a side view schematically showing an example of another configuration of the LED light bulb of Embodiment 4.

As shown in FIG. 7, an LED light bulb 20B of Embodiment 4 comprises a housing 21, a base 23, a globe 24, and the light source device 1B mounted on a mounting stage.

The housing 21 has an inverse truncated cone shape. The light source device 1B is fixed to the housing 21 inside the top surface side via the mounting stage (not shown), and the base 23 is fixed to the bottom surface side. A circuit board (not shown) in which a drive circuit is configured is stored inside the housing 21.

Although not shown, the mounting stage has a circular shape in plan view. The light source device 1B and the globe 24 are installed on one of the surfaces (mounting surface) of the mounting stage. A through hole is formed in the center of the mounting stage. In sum, the light source device 1B is installed on the mounting stage so that the bottom surface of the substrate 2 faces the mounting stage.

The base 23 is, for example, an E-type base. When using the LED light bulb 20B, the base 23 is screwed into a socket to enable electricity to flow to the light source device 1B.

The globe 24 is a cover member made of a transparent resin or the like and has a semi-spherical shape. The globe 24 is secured to the mounting stage 22 in the top end of the housing 21 so as to cover the mounting surfaces of the mounting stage and the light source device 1B. The globe 24 preferably consists of, for example, an opal glass, acrylic, or polycarbonate material. The dimension of the globe 24 is, for example, 60 mm in diameter (outer diameter) and 2.5 mm in thickness.

The light source device 1B has two lead wires (not shown) for cathode and anode. The lead wires are provided on the inside of a cylinder, where the lead wires are lead inside the housing 21 through a through hole of the mounting stage. The lead wires are then electrically connected to the drive circuit (not shown) stored in the housing 21.

According to Embodiment 4 from the above, the LED light bulb 20A or 20B comprises the light source device 1A or 1B comprising a board-like reflector erected and disposed vertically with respect to the top surface of the sealing resin 9 so as to traverse the center of a top surface of the substrate 2 or the sealing resin 9 while both side surfaces face outward and the plurality of LED chips 4 positioned to surround the reflector on the top surface of substrate 2. The reflector has a light reflecting function on outside surfaces. In addition, the outside surfaces of the reflector have a light reflecting function, and the light source device 1A or 1B is installed on the mounting stage so that the bottom surface of the substrate 2 faces a mounting plate.

Thereby, light radiating from the plurality of LED chips 4 is also reflected in a horizontal direction by the reflector erected on the same surface or a surface above the LED chips 4 on the substrate 2. Accordingly, horizontal luminous intensity can be obtained without a complex structure.

Thus, since a light distribution angle becomes wider in comparison to a conventional structure, the LED light bulb 20A or 20B with an enhanced light distribution characteristic with a simple configuration can be obtained.

As described above, the LED light bulb 20A or 20B of Embodiment 4 as an irradiation device of Embodiment 4 comprises the light source device 1, 1A, or 1B which reflects light radiated from the plurality of LED chips 4 on the substrate 2 in a horizontal direction that is parallel with respect to the mounting surface by the reflector disposed on the same surface as the plurality of LED chips 4. Thus, the light source device 1, 1A, or 1B having an enhanced light distribution characteristic with a simple configuration and the LED light bulb 20A or 20B as an irradiation device using the same can be obtained.

As described above, the present invention is exemplified by the use of its preferred Embodiments 1 to 4 of the present invention. However, the present invention should not be interpreted solely based on Embodiments 1 to 4. It is understood that the scope of the present invention should be interpreted solely based on the scope of the claims. It is also understood that those skilled in the art can implement equivalent scope of technology, based on the description of the present invention and common knowledge from the description of the detailed preferred Embodiments 1 to 4 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can not only be used suitably in the field related to light source devices that emit light with an LED as a light source and irradiation devices comprising the same, but also in the field related to a method of manufacturing a light source device or an irradiation device. In particular, the present invention is most suitable for LED irradiation light sources and LED irradiation instruments for which it is desirable to have a light distribution characteristic which is equivalent to that of incandescent light bulbs. In these technical fields, since a plurality of light emitting elements are positioned on a substrate so as to surround a reflector, a light distribution characteristic can be enhanced by the reflector after emitted light from each of the plurality of light emitting elements directly mounted on the substrate readily diffuses into each other. In addition, it is possible to readily manufacture a device with a simple configuration and to obtain an enhanced light distribution characteristic with sufficiently homogeneous diffused light.

The invention claimed is:

1. A light source device comprising a planar sheet reflector erected vertically above a sealing resin from a substrate or on the sealing resin, a plurality of light emitting elements positioned on the substrate so as to surround the reflector, and a light emitting section in which the plurality of light emitting elements are sealed with the sealing resin, at least both side surfaces of the reflector having a light reflecting function by which light irradiated from the light emitting section is reflected,
   wherein the reflector is disposed to traverse a center section of the light emitting section in one or multiple directions.

2. The light source device of claim 1, wherein the plurality of light emitting elements are directly mounted on the substrate.

3. The light source device of claim 1, wherein the reflector is directly mounted on the substrate and on a portion of a wiring pattern formed on the substrate.

4. The light source device of claim 1, wherein the reflector has a board-like semi-circular shape, semi-oval shape, or arcuate shape of the side that is cut off from a circular shape with a chord.

5. The light source device of claim 1, wherein the plurality of light emitting elements form the light emitting section by one or more series circuits, in which a plurality of light emitting elements are connected in series, being connected in parallel between bipolar wiring patterns.

6. The light source device of claim 1, wherein the reflector consists of a white or opal acrylic or polycarbonate material.

7. The light source device of claim 1, wherein the reflector is secured on the substrate with an adhesive, and a base of the reflector is secured by the sealing resin for sealing the plurality of light emitting elements and a resin dam for holding back the sealing resin.

* * * * *